United States Patent
Gao

(10) Patent No.: US 11,624,129 B1
(45) Date of Patent: Apr. 11, 2023

(54) GALLIUM ARSENIDE SINGLE CRYSTAL AND PREPARATION METHOD THEREOF

(71) Applicant: Shanxi China Crystal Technologies Co., Ltd., Shanxi (CN)

(72) Inventor: Youjun Gao, Shanxi (CN)

(73) Assignee: SHANXI CHINA CRYSTAL TECHNOLOGIES CO., LTD., Shanxi (CN)

( * ) Notice: Subject to any disclaimer, the term of this patent is extended or adjusted under 35 U.S.C. 154(b) by 0 days.

(21) Appl. No.: 17/841,243

(22) Filed: Jun. 15, 2022

(30) Foreign Application Priority Data

Apr. 18, 2022 (CN) .......................... 202210403538.1

(51) Int. Cl.
*C30B 15/10* (2006.01)
*C30B 29/42* (2006.01)
*C30B 15/14* (2006.01)

(52) U.S. Cl.
CPC .............. *C30B 29/42* (2013.01); *C30B 15/10* (2013.01); *C30B 15/14* (2013.01)

(58) Field of Classification Search
CPC ......... C30B 29/42; C30B 11/00; C30B 11/04; C30B 27/00; C30B 29/40
See application file for complete search history.

(56) References Cited

FOREIGN PATENT DOCUMENTS

| CN | 1844487 A | 10/2006 | |
|---|---|---|---|
| CN | 109252220 A | 1/2019 | |
| CN | 110257914 A | * 9/2019 | ............ C30B 29/42 |
| CN | 111321456 A | 6/2020 | |
| CN | 111893571 A | * 11/2020 | ........... C30B 11/065 |
| CN | 111893571 A | 11/2020 | |
| JP | 52096998 A | * 8/1977 | ............ C01B 27/02 |
| JP | 10259100 A | * 9/1998 | ............ C30B 29/42 |

OTHER PUBLICATIONS

European Patent Office, English computer translation of CN102579114 A (Year: 2022).*
European Patent Office, English computer translation of JP-10259100-A (Year: 2022).*
European Patent Office, English computer translation of CN-111893571-A (Year: 2022).*
English abstractor JP 52-96998 (Year: 2023).*

* cited by examiner

*Primary Examiner* — Matthew J Song
(74) *Attorney, Agent, or Firm* — Cooper Legal Group, LLC

(57) ABSTRACT

The present application discloses a gallium arsenide single crystal and preparation method thereof. The gallium arsenide single crystal has a carrier concentration of $1\times10^{18}$-$4\times10^{18}/cm^3$, and a migration rate of 1700-2600 $cm^2/v \cdot s$; at a same carrier concentration, B atom density in the gallium arsenide single crystal obtained using $Si_xAs_y$ compound as a dopant is at least 20% lower than that obtained using Si substance as a dopant; B content in the gallium arsenide single crystal is $5\times10^{18}/cm^3$ or lower. The preparation method for the gallium arsenide single crystal is that, before growth of the gallium arsenide single crystal, the $Si_xAs_y$ compound is distributed into a gallium arsenide polycrystal.

4 Claims, No Drawings

GALLIUM ARSENIDE SINGLE CRYSTAL AND PREPARATION METHOD THEREOF

CROSS-REFERENCE TO RELATED APPLICATION

The present application is based on and claims the priority benefits of China application No. 202210403538.1, filed on Apr. 18, 2022. The entirety of the above-mentioned patent application is hereby incorporated by reference herein and made a part of this specification.

TECHNICAL FIELD

The present application relates to the technical field of crystal synthesis, and particularly to a gallium arsenide single crystal and preparation method thereof.

BACKGROUND ART

Gallium arsenide (GaAs) has advantages of high speed, high frequency, high temperature resistance and low noise as an important semiconductor material. Comparing with a silicon single-crystal, gallium arsenide has high migration rate and better opto-electronic property, so that it is widely used in microelectronics and optoelectronics fields at present.

At present, in growth technology of a n-type gallium arsenide single crystal, VGF/VB (vertical gradient freeze method/vertical Bridgman technique) is widely used. During a growth process of n-type gallium arsenide single crystal, boron oxide is used as covering agent and wetting agent, so that PBN (pyrolytic boron nitride) as reaction vessel of VGF, gallium arsenide and boron oxide can infiltrate. At the same time, in order to increase a carrier concentration, silicon simple substance is added as dopant in the growth process of the n-type gallium arsenide single crystal. However, there is following reaction between silicon and boron oxide: $Si(melt)+B_2O_3 \Leftrightarrow SiO(B_2O_2)+B$ (melt) a large amount of B element enters into a melt to pollute the prepared gallium arsenide single crystal, so that the performance of the gallium arsenide single crystal is degraded.

SUMMARY

In order to decrease the possibility that the gallium arsenide single crystal is polluted by B element in the preparing process, and further to enhance the performance of the gallium arsenide single crystal, the present application provides a gallium arsenide single crystal and preparation method thereof.

In a first aspect, the present application provides a gallium arsenide single crystal by adopting the following technical solution:

a gallium arsenide single crystal, wherein the gallium arsenide single crystal has a carrier concentration of $1 \times 10^{18}$-$4 \times 10^{18}/cm^3$, and a migration rate of 1700-2600 $cm^2/v \cdot s$; at a same carrier concentration, the gallium arsenide single crystal obtained using $Si_xAs_y$ compound as a dopant has a B atom density of at least 20% lower than that obtained using Si substance as a dopant; and the gallium arsenide single crystal has a B content of $5 \times 10^{18}/cm^3$ or lower.

In traditional preparation technology for gallium arsenide single crystal, Si substance, boron oxide and gallium arsenide polycrystal are added together. However, in the present application, firstly, Si element is transformed into $Si_xAs_y$ compound, then the gallium arsenide single crystal begins to grow. Si in the prepared gallium arsenide single crystal has higher effective proportion, and the gallium arsenide single crystal is not easy to be polluted by B element. The B content in the gallium arsenide single crystal obtained using $Si_xAs_y$ compound as a dopant is decreased at a same Si carrier concentration, and the higher the Si carrier concentration, the more visible the effect.

In addition, a migration rate of the gallium arsenide single crystal in the present application is at least 20% higher than that in the traditional preparation technology of gallium arsenide single crystal at a same carrier concentration, and the opto-electronic property of single crystal is excellent.

In a second aspect, the present application provides a preparation method for the gallium arsenide single crystal by adopting the following technical solution:

a preparation method for the gallium arsenide single crystal including the following steps: before growing the gallium arsenide single crystal, distributing a $Si_xAs_y$ compound into a gallium arsenide polycrystal by one manner selected from a group consisting of:

manner 1: synthesizing the $Si_xAs_y$ compound while synthesizing a gallium arsenide polycrystal, then growing a single crystal;

manner 2: synthesizing the $Si_xAs_y$ compound, adding the $Si_xAs_y$ compound and a raw material gallium arsenide polycrystal into a single crystal growing vessel, and then growing a single crystal.

In the present application, the $Si_xAs_y$ compound is used as a dopant. Comparing with a traditional dopant silicon simple substance, silicon valence state in the $Si_xAs_y$ compound is increased to facilitate improving the probability of silicon occupying gallium sites, so that a reaction $Si(melt)+B_2O_3 \Leftrightarrow SiO(B_2O_2)+B$ (melt) can be inhibited, further a gallium arsenide single crystal is not susceptible to be polluted by B element, and B content is lower than that of Si. Comparing with the gallium arsenide single crystal prepared with Si substance as a dopant, a migration rate of the gallium arsenide single crystal prepared in the present application is increased by at least 20% at same carrier concentration.

Optionally, the manner 1 comprises:

(1) charging arsenic and gallium by a weight ratio of (107-128):100 into a first PBN boat and a second PBN boat respectively; and charging silicon for doping at a tail end of the second PBN boat charged with gallium, wherein a weight ratio of silicon to gallium is (0.2-5):10000.

(2) baking the first PBN boat and the second PBN boat for 2-4 h in a vacuum environment with a vacuum degree of $1 \times 10^{-4}$-$9 \times 10^{-2}$ Pa;

(3) after a quartz tube is welded and installed on a stove, heating the first PBN boat to 620-660° C., heating the second PBN boat to 1200-1400° C., and, holding for 2-4 h to obtain the gallium arsenide polycrystal and the $Si_xAs_y$ compound, respectively, in which a temperature was controlled, so that the second PBN boat has a temperature gradient of 2-4° C./cm decreasing from a head end to the tail end;

(4) taking out the gallium arsenide polycrystal containing the $Si_xAs_y$ compound; and (5) placing the synthesized gallium arsenide polycrystal containing the $Si_xAs_y$ compound and boron oxide into a single crystal growing vessel to grow a single crystal.

In above technical solution, the silicon simple substance can be transformed into the $Si_xAs_y$ compound during synthesizing gallium arsenide polycrystal, and the $Si_xAs_y$ compound and the gallium arsenide polycrystal do not need to be formed step by step.

Optionally, during the charging, a weight ratio of silicon for doping to gallium is (1-1.2):10000.

Optionally, the manner 2 comprises:

Step 1. synthesizing the $Si_xAs_y$ compound (1) charging arsenic and silicon by a weight ratio of (0.5-5): 1 into a first quartz boat and a second quartz boat respectively;

(2) heating the first quartz boat and the second quartz boat for 2-4 h in a vacuum environment with a vacuum degree of $1\times10^{-4}$-$9\times10^{-2}$ Pa; and (3) heating the first quartz boat to 650-700° C., the heating second quartz boat to 1050-1450° C., and holding for 2-4 h to obtain the $Si_xAs_y$ compound, wherein a temperature of the second quartz boat is decreased by a gradient of 5-8° C./cm; and Step 2. growing a single crystal placing the synthesized $Si_xAs_y$ compound, a gallium arsenide polycrystal and boron oxide into a single crystal growing vessel to grow a single crystal.

In above technical solution, the $Si_xAs_y$ compound is synthesized according to reaction principle $xSi+yAs \Leftrightarrow Si_xAs_y$. The $Si_xAs_y$ compound and gallium arsenide polycrystal are added together to further improve the performance of the gallium arsenide single crystal.

During the charging in Step 1, a weight ratio of silicon to gallium is (1-1.2):10000.

During synthesizing gallium arsenide compound in Step 1, the second quartz boat is heated to 1120-1150° C.

In Step 2, the $Si_xAs_y$ compound, gallium arsenide polycrystal and boron oxide are mixed by a weight ratio of (0.2-2):10000:(15-100).

In summary, the present application has the following beneficial effects:

in the present application, the silicon simple substance is replaced by the $Si_xAs_y$ compound as dopant, and the $Si_xAs_y$ compound is added into the gallium arsenide polycrystal before growing the single crystal. The silicon valence state of the $Si_xAs_y$ compound is increased to facilitate improving the probability of silicon occupying gallium sites, so that the possibility of the gallium arsenide single crystal polluted by a boron melt is decreased, and the carrier concentration of the gallium arsenide single crystal prepared is $1\times10^{18}$-$4\times10^{18}/cm^3$. At a same carrier concentration, B atom content is lower, that is, B atom density in the gallium arsenide single crystal prepared with the $Si_xAs_y$ compound as dopant is at least 20% lower than that prepared with Si substance as a dopant. And the higher the Si carrier concentration, the more visible the effect. At a same carrier concentration, a migration rate of crystal is increased.

DETAILED DESCRIPTION

In existing preparing process of the gallium arsenide for n-type opto-semiconductors, Si substance is used as a main dopant. However, Si substance used as dopant will inevitably introduce a large amount of B melt, such that the prepared gallium arsenide single crystal chip is polluted by B, and the electrical performance of gallium arsenide single crystal chip is degraded.

Over the years, the researchers have conducted a lot of researches on the preparing process of gallium arsenide single crystal. They found that a Si atomic radius is 113 pm (covalent radius), a Ga atomic radius is 126 pm, and the Si atomic radius is close to that of As and Ga. Therefore, Si may replace Ga atom in a gallium arsenide material to be a donor impurity, or replace As atom to be an acceptor impurity. Si has a variety of positions in crystals: a. Si replaces Ga to be $Si_{Ga}$; b. Si replaces as to be $Si_{As}$; c. Si is located at grain boundaries or near large grain dislocation and does not occupy a crystal lattice position.

For the above reasons, in the present application, the $Si_xAs_y$ compound replaces Si substance as dopant and is added into a gallium arsenide polycrystal before growing the gallium arsenide single crystal, so that a Si valence state can be improved, the probability of silicon occupying gallium sites can be increased, reaction $Si(melt)+B_2O_3 \Leftrightarrow SiO(B_2O_3)+B$ (melt) can be inhibited, the probability of B element entering the melt can be decreased, and B impurity content in prepared gallium arsenide single crystal can be decreased to below $5\times10^{18}/cm^3$. This technical solution especially applies to a case with large carrier concentrations, and particularly to a case where Si-doped carrier concentrations is greater than $1\times10^{18}/cm^3$. Comparing with the gallium arsenide single crystal prepared with Si substance as dopant, a migration rate of the gallium arsenide single crystal prepared in the present application is at least increased by 20% at a same carrier concentration.

EXAMPLES

Example 1

A 4-inch gallium arsenide single crystal was prepared by the following steps:

(1) charging 5.35 kg arsenic was charged into a first PBN boat and 5 kg gallium was charged into a second PBN boat according to a weight ratio of 1.07:1;

0.1 g silicon was charged at an tail end of the second PBN boat, a weight ratio of the silicon to the gallium was 0.2:10000;

the first PBN boat and the second PBN boat were horizontally placed into a quartz tube, and a distance between the first PBN boat and the second PBN boat was 300 mm, which ensured that there was a sufficient temperature difference between them.

(2) baking: the charged quartz tube was fixedly mounted on a stove and baked for 2 h in a vacuum environment with a vacuum degree of $1\times10^{-4}$ Pa;

(3) synthesizing a gallium arsenide polycrystal containing $Si_xAs_y$ compound: after the baked quartz tube was welded and installed in the stove, the first PBN boat was heated to 660° C., the second PBN boat was heated to 1200° C. After holding for 2 h, the gallium arsenide polycrystal and the $Si_xAs_y$ compound were obtained;

a temperature of the second PBN boat from a head end to the tail end was decreased by a gradient of 4° C./cm by controlling temperature in the quartz tube via a program, and a horizontal condensation rate was 6 cm/h.

(4) taking the gallium arsenide polycrystal out of the stove: when the temperature in the quartz tube was decreased to 200° C. or lower, the gallium arsenide polycrystal containing $Si_xAs_y$ compound was taken out of the stove;

(5) growing single crystal: the synthesized gallium arsenide polycrystal containing $Si_xAs_y$ compound and boron oxide were added into a 4-inch crucible. A charged single crystal quartz tube was placed into a single crystal stove according to traditional VGF process, after which the single crystal was grown according to traditional VGF process.

According to the test method specified in SJ/T 11488-2015, the carrier concentration and migration rate of the above-mentioned prepared crystals were tested, and the test results were as follows:

| Test Sites | Test items | | | |
|---|---|---|---|---|
| | Carrier Concentration (/cm³) | Migration Rate (cm²/v · s) | Si Content (ppm) | B Content (ppm) |
| Head Piece | $1.2 \times 10^{18}$ | 2480 | 10 | 8 |
| Tail Piece | $2.2 \times 10^{18}$ | 1850 | 19 | 14 |

Example 2

A 6-inch gallium arsenide single crystal was prepared by the following steps:
(1) charging
6.4 kg arsenic was charged into a first PBN boat and 5 kg gallium was charged into a second PBN boat according to a weight ratio of 1.28:1;
2.5 g silicon was charged at a tail end of the second PBN boat, a weight ratio of silicon to gallium was 5:10000;
the first PBN boat and the second PBN boat were horizontally placed into a quartz tube, and a distance between the first PBN boat and the second PBN boat was 300 mm, which ensured that there was a sufficient temperature difference between them.
(2) baking: a charged quartz tube was fixedly mounted on a stove and baked for 4 h in a vacuum environment with a vacuum degree of $9 \times 10^{-2}$ Pa;
(3) synthesizing polycrystal: after the baked quartz tube was welded and installed in the stove, the first PBN boat was heated to 620° C., the second PBN boat was heated to 1400° C. After holding for 4 h, the gallium arsenide polycrystal was obtained;
a temperature of the second PBN boat from head to tail end was decreased in a gradient of 2° C./cm by controlling temperature gradient in the quartz tube via a program, and a horizontal condensation rate was 4 cm/h.
(4) taking polycrystal out of the stove: when the temperature in the quartz tube was decreased to 200° C. or lower, the gallium arsenide polycrystal containing $Si_xAs_y$ compound was taken out of the stove;
(5) growing single crystal: the synthesized gallium arsenide polycrystal containing $Si_xAs_y$ compound and boron oxide were added into a 6-inch crucible;
a charged single crystal quartz tube was placed into a single crystal stove according to traditional VGF process, after which the single crystal was grown according to the traditional VGF process.
According to the test method specified in SJ/T 11488-2015, the carrier concentration and migration rate of the above-mentioned prepared crystals were tested, and the test results were as follows:

| Test Sites | Test Items | | | |
|---|---|---|---|---|
| | Carrier Concentration (/cm³) | Migration Rate (cm²/v · s) | Si Content (ppm) | B Content (ppm) |
| Head Piece | $1.2 \times 10^{18}$ | 2500 | 12 | 9 |
| Tail Piece | $2.6 \times 10^{18}$ | 1880 | 22 | 17 |

Example 3

This example provided a 6-inch gallium arsenide single crystal, and the difference between this example and Example 2 lied in: in the charging step, a weight ratio of Si for doping to Ga was different, and the weight ratio of Si for doping to Ga in this example was 1:10000.
According to the test method specified in SJ/T 11488-2015, the carrier concentration and migration rate of the above-mentioned prepared crystals were tested, and the test results were as follows:

| Test Sites | Test Items | | | |
|---|---|---|---|---|
| | Carrier Concentration (/cm³) | Migration Rate (cm²/v · s) | Si Content (ppm) | B Content (ppm) |
| Head Piece | $1.2 \times 10^{18}$ | 2530 | 11 | 6 |
| Tail Piece | $2.4 \times 10^{18}$ | 1840 | 21 | 14 |

Example 4

This example provided a 6-inch gallium arsenide single crystal, and the difference between this example and Example 1 lied in: in the charging step, a weight ratio of Si for doping to Ga was different, and the weight ratio of Si for doping to Ga in this example was 1.2:10000.
According to the test method specified in SJ/T 11488-2015, the carrier concentration and migration rate of the above-mentioned prepared crystals were tested, and the test results were as follows:

| Test Sites | Test Items | | | |
|---|---|---|---|---|
| | Carrier Concentration (/cm³) | Migration Rate (cm²/v · s) | Si Content (ppm) | B Content (ppm) |
| Head Piece | $1.2 \times 10^{18}$ | 2550 | 12 | 6 |
| Tail Piece | $2.4 \times 10^{18}$ | 1860 | 22 | 15 |

Example 5

A 4-inch gallium arsenide single crystal was prepared by the following steps:
Step 1. synthesizing $Si_xAs_y$ compound
(1) charging: 5 g arsenic and 10 g silicon were charged in a first quartz boat and a second quartz boat respectively, then the first quartz boat and the second quartz boat were horizontally placed into a quartz tube;
(2) baking: the charged quartz tube was fixedly mounted and baked for 2 h in a vacuum environment with a vacuum degree of $1 \times 10^{-4}$ Pa;
(3) synthesizing $Si_xAs_y$ compound: after the baked quartz tube was welded and installed in the stove, the first quartz boat was heated to 650° C., and the second quartz boat was heated to 1050° C. After holding for 4 h, the $Si_xAs_y$ compound was obtained;
a temperature of the second quartz boat from a head end to the tail end was decreased by a gradient of 5° C./cm by controlling temperature in the quartz tube. When the temperature in the quartz tube was 200° C. or lower, the $Si_xAs_y$ compound was taken out.
Step 2. growing single crystal
0.2 g prepared $Si_xAs_y$ compound, 10 kg gallium arsenide polycrystal and 15 g boron oxide were added into a crucible, then the crucible was placed into a single crystal quartz tube. The charged single crystal quartz tube was placed into a single crystal stove according to traditional VGF process, after which the single crystal was grown according to traditional VGF process.

According to the test method specified in SJ/T 11488-2015, the carrier concentration and migration rate of the above-mentioned prepared crystals were tested, and the test results were as follows:

| Test Sites | Test Items | | | |
|---|---|---|---|---|
| | Carrier Concentration (/cm$^3$) | Migration Rate (cm$^2$/v · s) | Si Content (ppm) | B Content (ppm) |
| Head Piece | $1.4 \times 10^{18}$ | 2220 | 12 | 8 |
| Tail Piece | $2.8 \times 10^{18}$ | 1850 | 27 | 16 |

Example 6

A 6-inch gallium arsenide single crystal was prepared by the following steps:

Step 1. synthesizing Si$_x$As$_y$ compound (1) charging: 50 g arsenic and 10 g silicon were charged into a first quartz boat and a second quartz boat respectively, then the first quartz boat and the second quartz boat were horizontally placed into a quartz tube;

(2) baking: the charged quartz tube was fixedly mounted and baked for 4 h in a vacuum environment with a vacuum degree of $1 \times 10^{-4}$ Pa;

(3) synthesizing Si$_x$As$_y$ compound: after the baked quartz tube was welded and installed in the stove, the first quartz boat was heated to 700° C., and the second quartz boat was heated to 1450° C. After holding for 2 h, the Si$_x$As$_y$ compound was obtained;

a temperature of the second quartz boat from head to tail end was decreased in a gradient of 8° C./cm by controlling temperature gradient in the quartz tube. When the temperature in the quartz tube was 200° C. or lower, the Si$_x$As$_y$ compound was taken out.

Step 2. growing single crystal 20 g prepared Si$_x$As$_y$ compound, 10 kg gallium arsenide polycrystal and 100 g boron oxide were added into a 6-inch crucible, then the crucible was placed into a single crystal quartz tube. The charged single crystal quartz tube was placed into a single crystal stove according to traditional VGF process, after which the single crystal was grown according to the traditional VGF process.

According to the test method specified in SJ/T 11488-2015, the carrier concentration and migration rate of the above-mentioned prepared crystals were tested, and the test results were as follows:

| Test Sites | Test Items | | | |
|---|---|---|---|---|
| | Carrier Concentration (/cm$^3$) | Migration Rate (cm$^2$/v · s) | Si Content (ppm) | B Content (ppm) |
| Head Piece | $1.4 \times 10^{18}$ | 2310 | 14 | 10 |
| Tail Piece | $2.8 \times 10^{18}$ | 1820 | 30 | 18 |

Example 7

This example provided a 6-inch gallium arsenide single crystal, and the difference between this example and Example 6 lied in: in the charging of Step 1, a weight ratio of Si to Ga was different, and the weight ratio of Si to Ga in this example was 1:10000.

According to the test method specified in SJ/T 11488-2015, the carrier concentration and migration rate of the above-mentioned prepared crystals were tested, and the test results were as follows:

| Test Sites | Test Items | | | |
|---|---|---|---|---|
| | Carrier Concentration (/cm$^3$) | Migration Rate (cm$^2$/v · s) | Si Content (ppm) | B Content (ppm) |
| Head Piece | $1.4 \times 10^{18}$ | 2400 | 12 | 7 |
| Tail Piece | $3.0 \times 10^{18}$ | 1760 | 28 | 16 |

Example 8

This example provided a 6-inch gallium arsenide single crystal, and the difference between this example and Example 6 lied in: in the charging of Step 1, a weight ratio of Si to Ga was different, and the weight ratio of Si to Ga in this example was 1.2:10000.

According to the test method specified in SJ/T 11488-2015, the carrier concentration and migration rate of the above-mentioned prepared crystals were tested, and the test results were as follows:

| Test Sites | Test Items | | | |
|---|---|---|---|---|
| | Carrier Concentration (/cm$^3$) | Migration Rate (cm$^2$/v · s) | Si Content (ppm) | B Content (ppm) |
| Head Piece | $1.4 \times 10^{18}$ | 2440 | 14 | 9 |
| Tail Piece | $3.2 \times 10^{18}$ | 1730 | 30 | 16 |

Example 9

This example provided a 6-inch gallium arsenide single crystal, and the difference between this example and Example 8 lied in: in synthesizing Si$_x$As$_y$ compound of Step 1, the second quartz boat was heated in different temperature, and the second quartz boat was heated at 1120° C. in this example.

According to the test method specified in SJ/T 11488-2015, the carrier concentration and migration rate of the above-mentioned prepared crystals were tested, and the test results were as follows:

| Test Sites | Test Items | | | |
|---|---|---|---|---|
| | Carrier Concentration (/cm$^3$) | Migration Rate (cm$^2$/v · s) | Si Content (ppm) | B Content (ppm) |
| Head Piece | $1.4 \times 10^{18}$ | 2480 | 14 | 8 |
| Tail Piece | $3.2 \times 10^{18}$ | 1700 | 28 | 15 |

COMPARATIVE EXAMPLE

A 4-inch gallium arsenide single crystal was prepared by the following steps:

growing single crystal: the gallium arsenide polycrystal, boron oxide and appropriate amount of silicon were added into a crucible, then the crucible was placed into a single crystal quartz tube.

The charged single crystal quartz tube was placed into a single crystal stove according to traditional VGF process, after which the single crystal was grown according to traditional VGF process.

According to the test method specified in SJ/T 11488-2015, the carrier concentration and migration rate of the above-mentioned prepared crystals were tested, and the test results were as follows:

| Test Sites | Test Items | | | |
|---|---|---|---|---|
| | Carrier Concentration (/cm$^3$) | Migration Rate (cm$^2$/v · s) | Si Content (ppm) | B Content (ppm) |
| Head Piece | $1.2 \times 10^{18}$ | 2020 | 12 | 14 |
| Tail Piece | $2.6 \times 10^{18}$ | 1550 | 24 | 26 |

Analysis of Test Results

Comparative Example was traditional preparation method for gallium arsenide, in which Si substance was taken as a dopant. Comparing with Example 1, at a same carrier concentration ($1.2 \times 10^8$/cm$^3$), the migration rate of the gallium arsenide single crystal was only 2020 cm$^2$/v s, which was much lower than 2480 cm$^2$/v s in Example 1. Meanwhile, after testing element content, it can be seen that, B content in Example 1 was only 8 ppm, which was much lower than that of the gallium arsenide single crystal prepared in Comparative Example, and the effective proportion of Si in Examples 1 and 3 were higher.

The difference between Example 1 and Example 5 only lied in: an timing of adding $Si_xAs_y$ compound was different. As can be seen from the test results of Example 1 and 3, a method for preparing single crystal that synthesizing $Si_xAs_y$ compound first and then blending with the gallium arsenide polycrystal was able to improve the carrier concentration and migration rate of the gallium arsenide single crystal more effectively.

The above are preferred embodiments of the present application, which are not intended to limit the protection scope of the present application. Therefore, all equivalent changes made according to the structure, shape and principle of the present application should be within the protection scope of the present application.

What is claimed is:

1. A preparation method for a gallium arsenide single crystal, comprising the following steps: before growth of the gallium arsenide single crystal, distributing a $Si_xAs_y$ compound into a gallium arsenide polycrystal by:

synthesizing the $Si_xAs_y$ compound, adding the $Si_xAs_y$ compound and a raw material gallium arsenide polycrystal into a single crystal growing vessel, and then growing a single crystal, which comprises:

Step 1: synthesizing the $Si_xAs_y$ compound, comprising:
(1) charging arsenic and silicon by a weight ratio of (0.5-5):1 into a first quartz boat and a second quartz boat, respectively;
(2) baking the first quartz boat and the second quartz boat for 2-4 h in a vacuum environment with a vacuum degree of $1 \times 10^{-4}$-$9 \times 10^{-2}$ Pa; and
(3) heating the first quartz boat to 650-700° C., heating the second quartz boat to 1050-1450° C.; and holding for 2-4 h to obtain the $Si_xAs_y$ compound, wherein a temperature of the second quartz boat is decreased by a gradient of 5-8° C./cm; and Step 2: growing the single crystal, comprising:
placing the $Si_xAs_y$ compound, the gallium arsenide polycrystal and boron oxide into the single crystal growing vessel to grow the single crystal.

2. The preparation method for the gallium arsenide single crystal according to claim 1, wherein, the gallium arsenide single crystal has a carrier concentration of $1 \times 10^{18}$-$4 \times 10^{18}$/cm$^3$, and a migration rate of 1700-2600 cm$^2$/v·s; and a B content of the gallium arsenide single crystal is $5 \times 10^{18}$/cm$^3$ or lower.

3. The preparation method for the gallium arsenide single crystal according to claim 1, wherein, during synthesizing the $Si_xAs_y$ compound in Step 1, the second quartz boat is heated to 1120-1150° C.

4. The preparation method for the gallium arsenide single crystal according to claim 1, wherein, in Step 2, the $Si_xAs_y$ compound, the gallium arsenide polycrystal and the boron oxide are mixed by a weight ratio of (0.2-2):10000:(15-100).

* * * * *